(12) United States Patent
Matsumoto

(10) Patent No.: US 9,199,337 B2
(45) Date of Patent: Dec. 1, 2015

(54) METHOD AND APPARATUS FOR DETERMINING ACCEPTANCE/REJECTION OF FINE DIAMETER WIRE BONDING

(75) Inventor: Jun Matsumoto, Saitama (JP)

(73) Assignee: JTEKT CORPORATION (JP)

( * ) Notice: Subject to any disclaimer, the term of this patent is extended or adjusted under 35 U.S.C. 154(b) by 590 days.

(21) Appl. No.: 13/635,026

(22) PCT Filed: Mar. 8, 2011

(86) PCT No.: PCT/JP2011/055367
§ 371 (c)(1),
(2), (4) Date: Sep. 14, 2012

(87) PCT Pub. No.: WO2011/114945
PCT Pub. Date: Sep. 22, 2011

(65) Prior Publication Data
US 2013/0006565 A1    Jan. 3, 2013

(30) Foreign Application Priority Data

Mar. 16, 2010  (JP) .................................. 2010-058873

(51) Int. Cl.
*G06F 19/00*   (2011.01)
*B23K 31/12*   (2006.01)
(Continued)

(52) U.S. Cl.
CPC .............. *B23K 31/125* (2013.01); *H01L 22/12* (2013.01); *H01L 24/78* (2013.01); *H01L 24/85* (2013.01);
(Continued)

(58) Field of Classification Search
CPC .......... G01N 25/72; G06F 19/00; B23K 1/00; H01L 21/66; H05K 3/34
USPC .......................................................... 702/82
See application file for complete search history.

(56) References Cited

U.S. PATENT DOCUMENTS 6,428,202 B1 *  8/2002  Mitsuhashi et al. .............. 374/5
7,114,846 B2 * 10/2006  Tominaga et al. ............ 374/121
(Continued)

FOREIGN PATENT DOCUMENTS

JP          980000       5/1973
JP       5-261576 A    10/1993
(Continued)

OTHER PUBLICATIONS

Matsumoto, Inspection Method of Micro Metal Jointed, Aprial 2 2009, JP2009069009A,Japanies.*
(Continued)

*Primary Examiner* — John Breene
*Assistant Examiner* — Mohammad Islam
(74) *Attorney, Agent, or Firm* — Schmeiser, Olsen & Watts, LLP

(57) ABSTRACT

Disclosed are a method and apparatus for determining acceptance/rejection of fine diameter wire bonding of semiconductor devices, LED devices, and the like, which has been impossible with conventional methods, such as the method by image processing, with high accuracy and with no contact. The apparatus includes a heating laser device 1 for spot-heating the bonding portion of a fine diameter wire; a two-wavelength infrared radiation thermometer 2 for measuring temperature at high speed on the basis of a minute amount of infrared rays radiated from the heated portion of the fine diameter wire with correction of the emissivity; and a correction computing and determining means 4 for correcting the result of measurement with the two-wavelength infrared radiation thermometer 2 to a temperature change with the reference heating power, and then determining acceptance/rejection of the bonding by comparing the corrected temperature change or a numerical value correlated to a bonding area obtained from that temperature change, with a temperature change indicated by an acceptable product as a comparison criterion that has been corrected to the reference heating power or a numerical value correlated to a bonding area obtained from that temperature change.

9 Claims, 3 Drawing Sheets

(51) Int. Cl.
*H01L 21/66* (2006.01)
*H01L 23/00* (2006.01)

(52) U.S. Cl.
CPC ............. *B23K 2201/40* (2013.01); *H01L 24/45* (2013.01); *H01L 24/48* (2013.01); *H01L 2224/45015* (2013.01); *H01L 2224/45144* (2013.01); *H01L 2224/48091* (2013.01); *H01L 2224/48463* (2013.01); *H01L 2224/48472* (2013.01); *H01L 2224/78263* (2013.01); *H01L 2224/859* (2013.01)

(56) References Cited

U.S. PATENT DOCUMENTS

| | | |
|---|---|---|
| 2002/0072878 A1 | 6/2002 | Kanehira et al. |
| 2006/0114965 A1* | 6/2006 | Murphy et al. ............... 374/120 |
| 2006/0278113 A1* | 12/2006 | Kawagoe et al. ............ 101/494 |
| 2010/0238468 A1 | 9/2010 | Eguchi |

FOREIGN PATENT DOCUMENTS

| | | | |
|---|---|---|---|
| JP | 7190992 A | | 7/1995 |
| JP | 7235576 A | | 9/1995 |
| JP | 2002253062 A | | 9/2002 |
| JP | 2006-258721 A | | 9/2006 |
| JP | 2007192579 A | | 8/2007 |
| JP | 2007209676 A | | 8/2007 |
| JP | 2008-145344 A | | 6/2008 |
| JP | 2009069009 A | * | 4/2009 |

OTHER PUBLICATIONS

Matsumoto, Inspection Method of Micro Metal Jointed, Aprial 2 2009, JP2009069009A,English.*
International Search Report; PCT/JP2011/055367; International File Date: Mar. 8, 2011; Matsumoto, Jun; 2 pages.

* cited by examiner (A)

(B)

METHOD AND APPARATUS FOR DETERMINING ACCEPTANCE/REJECTION OF FINE DIAMETER WIRE BONDING

TECHNICAL FIELD

The present invention relates to a method and apparatus for determining acceptance/rejection of fine diameter wire bonding of a gold material, and the like, and particularly relates to a method and apparatus for determining acceptance/rejection of bonding of a fine diameter wire connecting between a device and a lead frame, which is performed in manufacturing of an electronic component, such as a semiconductor device or an LED device, on the basis of the measurement of the bonding area.

BACKGROUND ART

Generally, methods for jointing metals to one another can be classified into the fusion welding with which the materials to be jointed are fused to be jointed; the pressure welding with which the materials to be jointed are kept as a solid, but jointed by diffusion of the metal atoms; the brazing with which the materials to be jointed are kept as a solid, but jointed through another material for brazing; and the adhesion with which an adhesive is used for jointing the materials.

Here, there will be a discussion about bonding of a fine diameter wire in manufacturing of electronic components. With the high-performance miniaturization of electronic equipment, miniaturization and high-density packaging of electronic components have been progressed, and this trend has caused a demand for highly reliable and sophisticated bonding techniques. For bonding of small-sized components, such as the above-mentioned electronic components, soldering (belonging to the category of brazing), ultrasonic welding or resistance welding (both belonging to the category of pressure welding), or adhesion are being used.

Conventionally, as methods for determining acceptance/rejection of such a minute metal bonding portion by conducting a test after the bonding, the method by visual inspection (Japanese Unexamined Patent Application Publication No. Hei 7-190992, and the like); the method by image processing (Japanese Unexamined Patent Application Publication No. 2001-60605, and the like); the method by appearance observation, making evaluation by X-ray radiographic test, or the like (Japanese Unexamined Patent Application Publication No. Hei 9-80000, and the like); the method by power-on test (Japanese Unexamined Patent Application Publication No. 2006-35237, and the like); the method by tensile test (Japanese Unexamined Patent Application Publication No. Hei 7-235576, and the like); the method by non-appearance observation, making evaluation on the basis of heat distribution, or the like (Japanese Unexamined Patent Application Publication No. 2001-215187, and the like); and the like, are known.

However, the above-mentioned evaluation method by visual inspection is a method by microscope observation, and therefore, inspection by a skilled craftsman can be expected, however, it involves a large individual difference, presenting problems in points of uniformity in quality and recruitment, and the evaluation method by image processing is a method which makes computer image processing to determine acceptance/rejection on the basis of the position or appearance geometry, and it can be automated, however, with it, there is a problem that evaluating the bonding state to determine acceptance/rejection on the basis of the appearance is considerably difficult.

Further, the evaluation method by conducting an X-ray radiographic test is a method of determining acceptance/rejection of the bonding state on the basis of the X-ray radiographic test, and it allows the bonding portion to be directly observed, however, it presents such a problem as that, in order to evaluate the bonding portion for determining acceptance/rejection, still higher resolving power is required. In addition, the evaluation method by conducting a power-on test is a method which actually conducts a power-on operation test, and it has a high reliability, but in order to determine acceptance/rejection of the bonding state, it is fundamentally required to pass a large current for evaluation, and thus this method is not a realistic one.

Furthermore, the evaluation method by conducting a tensile test is a method which tests the tensile strength, and it has a high reliability, but involves a destructive inspection, thus presenting a problem that it is impossible to make a total inspection. The evaluation method on the heat distribution allows inspection to be made non-destructively, however, it presents many problems, such as that about correlation between the heat distribution and the bonding state, and that a practicable two-dimensional heat sensor is expensive.

CITATION LIST

Patent Literature

Patent document 1: Japanese Unexamined Patent Application Publication No. Hei 7-190992
Patent document 2: Japanese Unexamined Patent Application Publication No. 2001-60605
Patent document 3: Japanese Unexamined Patent Application Publication No. Hei 9-80000
Patent document 4: Japanese Unexamined Patent Application Publication No. 2006-35237
Patent document 5: Japanese Unexamined Patent Application Publication No. Hei 7-235576
Patent document 6: Japanese Unexamined Patent Application Publication No. 2001-215187

DISCLOSURE OF THE INVENTION

Problems to be Solved by the Invention

As described above, the aforementioned conventional various methods for determining acceptance/rejection of a minute metal bonding portion present problems such as that uniformity in quality and reliability are not assured; evaluation and total inspection are difficult; and the cost tends to become high. Then, it is an object of the present invention to provide a method and apparatus for determining acceptance/rejection of fine diameter wire bonding that are free from such problems, in other words, offer high evaluation reliability, are available at a relatively low cost, and allow determining acceptance/rejection of the bonding state of a fine diameter wire that has been impossible to be evaluated with conventional image inspection methods, and the like.

Means for Solving the Invention

The present inventor has completed the present invention on the basis of the finding that, since the quantity of heat conducted is in proportion to the bonding density and the bonding area between the bonding members, measuring the quantity of heat conducted from one of the bonding members to the other in the bonding portion and analyzing the result of measurement will give a bonding area in the bonding of a fine diameter wire, and on the basis of the bonding area, acceptance/rejection of the pertinent bonding state will be able to be determined.

In other words, the method for determining acceptance/rejection of fine diameter wire bonding in accordance with the present invention for solving the aforementioned problems is a method for determining acceptance/rejection of fine diameter wire bonding on the basis of the bonding area, including: a heating step of heating the bonding portion of a fine diameter wire with a laser device of a fine spot diameter; a temperature measurement step of performing a temperature measurement at high speed with correction of the emissivity on the basis of a minute amount of infrared rays radiated from a heated portion of the bonding portion of the fine diameter wire; a correction step of correcting the result of measurement in the temperature measurement step for absorptivity of laser; and an acceptance/rejection determination step of determining acceptance/rejection of bonding of the fine diameter wire by computing, on the basis of the measuring temperature corrected in the correction step, the corrected temperature change or a numerical value which is correlated to a bonding area obtained from that temperature change, and comparing this with a temperature change for an acceptable product as a comparison criterion or a numerical value that has been previously obtained by a similar step and stored.

And, the temperature measurement in the temperature measurement step being for measuring the temperature change until the saturation temperature at which a great temperature change is not observable; the correction in the correction step being for correcting the temperature change measured in the temperature measurement step to the temperature change with the reference heating power in order to correct for absorptivity of laser; and the acceptance/rejection determination in the acceptance/rejection determination step being performed by comparing and contrasting the corrected temperature change in the correction step or a numerical value which is correlated to a bonding area obtained from that temperature change, with a temperature change indicated by an acceptable product as a comparison criterion that has been corrected to the temperature change with the reference heating power or a numerical value which is correlated to a bonding area obtained from that temperature change that has been previously obtained by a similar step and stored.

In a preferred embodiment, heating in the heating step is performed with a heating laser device having a spot diameter equal to or smaller than the wire diameter, for example, having a spot diameter of 20 μm, and measurement of the temperature change in the temperature measurement step is performed with a two-wavelength radiation thermometer allowing a temperature measurement for a minute area with correction of the emissivity. In one embodiment, appearance inspection by image processing is used in conjunction.

Further, the apparatus for determining acceptance/rejection of fine diameter wire bonding in accordance with the present invention for solving the aforementioned problems is an apparatus for determining acceptance/rejection of fine diameter wire bonding on the basis of the bonding area of the bonding portion, the apparatus including: a heating laser device for spot-heating of the bonding portion of the fine diameter wire; a two-wavelength infrared radiation thermometer for performing a temperature measurement at high speed with correction of the emissivity on the basis of a minute amount of infrared rays radiated from a heated portion of the fine diameter wire; and an acceptance/rejection determining means for determining acceptance/rejection of fine diameter wire bonding by correcting the result of measurement with the two-wavelength infrared radiation thermometer for absorptivity of laser, and then comparing the corrected temperature change or a numerical value which is correlated to a bonding area obtained from that temperature change, with a temperature change indicated by an acceptable product as a comparison criterion that has been corrected to the temperature change with the reference heating power or a numerical value which is correlated to a bonding area obtained from that temperature change that has been previously obtained by a similar step and stored.

In a preferred embodiment, the heating laser device has a spot wire diameter equal to or larger than the wire diameter, and the two-wavelength infrared radiation thermometer is carried by a measuring head portion having a swinging function for measuring a wedge bonding portion and a ball bonding portion of the fine diameter wire.

Further, the apparatus for determining acceptance/rejection of fine diameter wire bonding may further include a movement means for positioning the bonding portion of the fine diameter wire in a measuring position, or further include an image processing apparatus for performing appearance inspection by image processing.

Advantages of the Invention

The method and the apparatus for determining acceptance/rejection of fine diameter wire bonding in accordance with the present invention is as described above, providing a method and apparatus which are easy to be handled, having a convenient configuration, and allowing the influence of the absorptivity at the time of laser heating and the influence of the emissivity at the time of measurement of the amount of radiation of infrared rays to be neglected, whereby acceptance/rejection determination of the bonding state of the bonding portion of a fine diameter wire can be performed with high accuracy, being not affected by the surface condition of the bonding portion, and therefore, the present invention will contribute to a substantial improvement of the evaluation and reliability in bonding of the bonding portion of a fine diameter wire of semiconductors, LEDs, and the like.

BEST MODE FOR CARRYING OUT THE INVENTION

The method for determining acceptance/rejection of fine diameter wire bonding in accordance with the present invention for solving the aforementioned problems is a method for determining acceptance/rejection of fine diameter wire bonding on the basis of the bonding area, including: a heating step of heating the bonding portion of a fine diameter wire with a laser device of a fine spot diameter; a temperature measurement step of performing a temperature measurement at high speed with correction of the emissivity on the basis of a minute amount of infrared rays radiated from a heated portion of the bonding portion of the fine diameter wire; a correction step of correcting the result of measurement in the temperature measurement step for absorptivity of laser; and an acceptance/rejection determination step of determining acceptance/rejection of bonding by comparing, on the basis of the measuring temperature corrected in the correction step, the corrected temperature change or a numerical value which is correlated to a bonding area obtained from that temperature change, with a temperature change indicated by an acceptable product as a comparison criterion that has been corrected to the temperature change with the reference heating power or a numerical value which is correlated to the bonding area obtained from that temperature change.

Further, the apparatus for determining acceptance/rejection of fine diameter wire bonding in accordance with the present invention is for implementing the aforementioned method, being an apparatus for determining acceptance/rejection of fine diameter wire bonding on the basis of the bonding area of the bonding portion of a fine diameter wire, including: a heating laser device for spot-heating of the bonding portion of the fine diameter wire; a two-wavelength infrared radiation thermometer for performing a temperature measurement at high speed with correction of the emissivity on the basis of a minute amount of infrared rays radiated from a heated portion of the bonding portion of the fine diameter wire; and a correction computing and determining means for determining acceptance/rejection of bonding by correcting the result of measurement with the two-wavelength infrared radiation thermometer for absorptivity of laser, and then, on the basis of that corrected temperature change, comparing the corrected temperature change or a numerical value which is correlated to a bonding area obtained from that temperature change, with a temperature change indicated by an acceptable product as a comparison criterion that has been corrected to the temperature change with the reference heating power or a numerical value which is correlated to the bonding area from that temperature change.

Hereinbelow, an acceptance/rejection determination method and apparatus for bonding of fine diameter wire in accordance with the present invention will be explained in detail with reference to the attached drawings.

Figure 1:
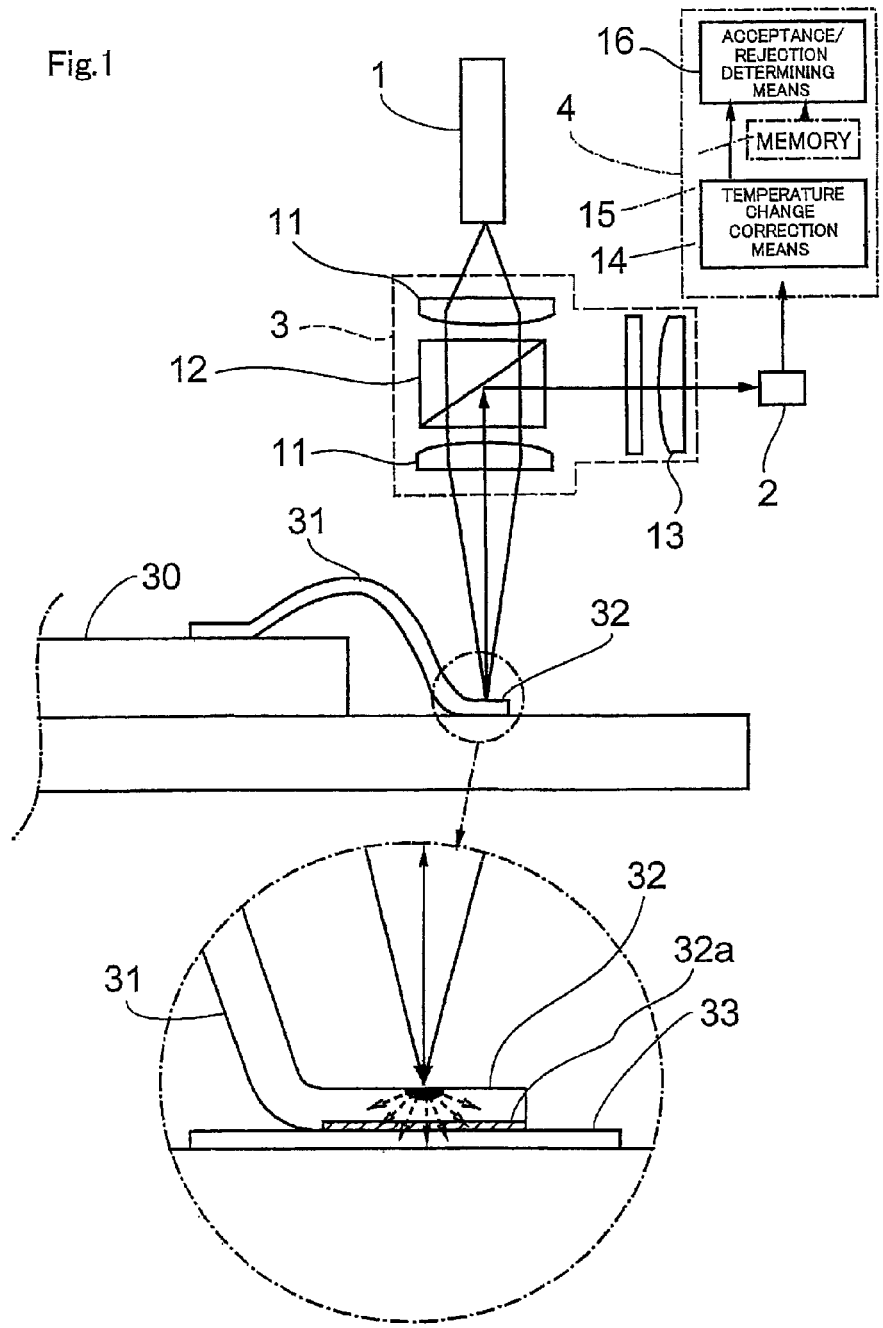
FIG. 1 is a drawing showing a schematic configuration of an acceptance/rejection determination apparatus for bonding of fine diameter wire in accordance with the present invention.

FIG. 1 is a drawing showing a schematic configuration of an acceptance/rejection determination apparatus for bonding of fine diameter wire in accordance with the present invention, and the apparatus is comprised of a heating laser device 1, a two-wavelength infrared radiation thermometer 2, a measuring head portion 3 preferably having a swinging function and including an optical system, and a correction computing and determining means 4 for determining acceptance/rejection of the bonding state. A preferred embodiment further includes a stage movement means (not shown) for moving a stage 5 in the X-Y-Z axis direction to properly position a bonding portion 32 as the inspected portion of a fine diameter wire 31 of a device 30, such as a semiconductor, LED, or the like, set on the stage 5 under the measuring head portion 3.

The heating laser device 1 is for spot-heating the bonding portion 32 of the fine diameter wire 31 of the device 30, such as a semiconductor, LED, of the like, and it is recommended to use a semiconductor laser device which is capable of power change and on-off control at high speed with no contact. The laser light from this heating laser device 1 is condensed through an optical system of the measuring head portion 3 later described down to a spot diameter of, for example, 20 µm. The heating laser device 1 continuously heats the bonding portion 32 of the fine diameter wire 31 with the same power until the saturation temperature at which no temperature change is observable is reached.

As a temperature change measuring means, a two-wavelength infrared radiation thermometer 2 is preferably used. The two-wavelength infrared radiation thermometer 2 performs temperature measurement at high speed with no contact on the basis of a minute amount of infrared rays radiated from the spot diameter portion of the bonding portion 32 that is given by the heating laser device 1, in other words, the heated portion, measuring a temperature change until the saturation temperature at which no temperature change is observable in the heated portion of the bonding portion 32 is reached. This two-wavelength infrared radiation thermometer 2 measures the temperature change in the heated portion of the bonding portion 32 that is associated with laser irradiation, using a method with which the temperature measurement error attributable to the influence of the emissivity at the time of radiation temperature measurement of the bonding portion 32 can be substantially neglected.

Figure 3:
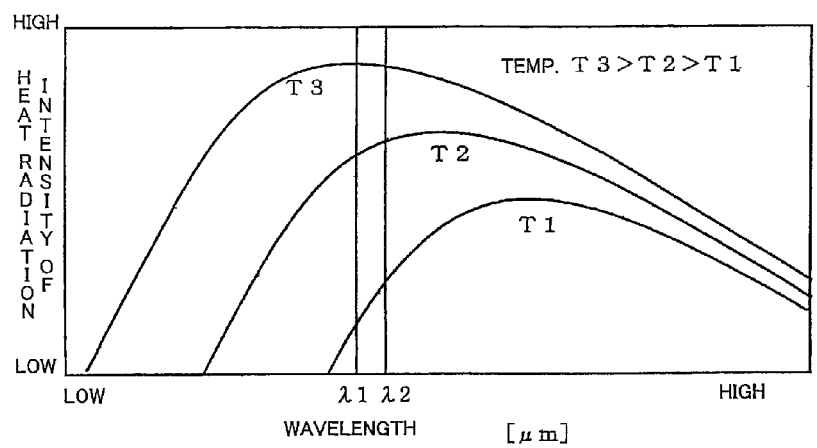
FIG. 3 is a graph illustrating the relation between wavelength and intensity of infrared rays.

This point will be explained in detail here. It is known that, as shown in FIG. 3, with a parabolic curve drawn by the respective wavelengths of the infrared rays emitted at a given temperature and the intensity, the point where a maximum intensity is generated is displaced toward the short wavelength side as the temperature is raised. However, the measurement with a radiation thermometer used in the prior art is based on a full wavelength range or a specific single wavelength, with the intensity indicated by the parabola therefor being used as the amount of infrared rays, thereby being significantly influenced by the emissivity, resulting in impossibility of effecting an accurate temperature measurement, and thus a proper acceptance/rejection determination.

Then, the present invention uses the two-wavelength radiation thermometer 2 which is different from the conventional radiation thermometer. This two-wavelength radiation thermometer 2 detects the amount of infrared rays only for two specific wavelengths ($\lambda 1$ and $\lambda 2$ in FIG. 3) to determine the ratio thereof, and outputs the temperature corresponding to that ratio as the temperature of the surface of the bonding portion 32 that is the inspection portion. Therefore, although this two-wavelength radiation thermometer 2 is influenced by the emissivity of the bonding portion 32, the influence is canceled with the two-wavelength ratio, whereby the influence of the emissivity of the bonding portion 32 can be neglected, and therefore accurate temperature measurement can be carried out.

Figure 2:
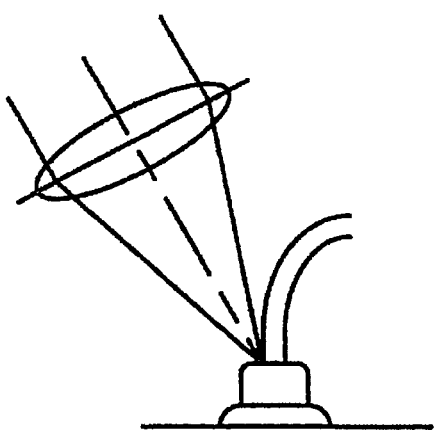
FIG. 2 is a drawing showing a configuration of a part of the acceptance/rejection determination apparatus for bonding of fine diameter wire in accordance with the present invention.
Figure 2:
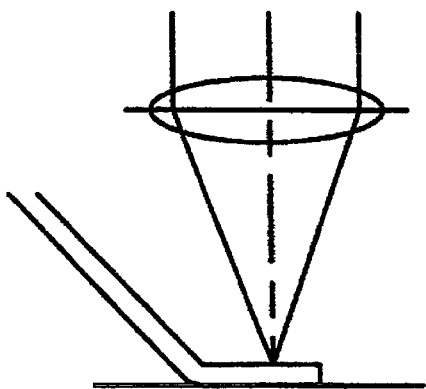

The measuring head portion 3 is on the optical axis of the laser irradiated from the heating laser device 1, including an optical system comprised of, for example, a condenser lens 11 for condensing the laser to a predetermined diameter on the surface of the bonding portion 32, a dichroic filter 12 for directing the infrared rays emitted from the bonding portion 32 irradiated with laser light toward the two-wavelength infrared radiation thermometer 2, and a condenser lens 13 for condensing the infrared rays. In addition, in the measuring head portion 3, an appropriately configured swinging function is incorporated in order to allow measurement of both the ball bonding portion (see FIG. 2(A)) and the wedge bonding portion (see FIG. 2(B)). Further, in general, the heating laser device 1 and the two-wavelength radiation thermometer 2 are loaded on the measuring head portion 3.

The correction computing and determining means 4, which is a control computer, corrects the absorptivity of laser from the result of measurement with the measuring head portion 3, and determines acceptance/rejection of the bonding by comparing the corrected temperature change or a numerical value which is correlated to a bonding area obtained from that temperature change, with a temperature change indicated by an acceptable product as a comparison criterion that has been corrected to the temperature change with the reference heating power or a numerical value which is correlated to a bonding area obtained from that temperature change. This correction computing and determining means 4 includes a temperature change correction means 14 for correcting the temperature change measured in the heated portion of the bonding portion 32 to a temperature change with the reference heating power, a memory 15 for storing a temperature change indicated by an acceptable product which is regarded to have absorbed the reference heating power, or a numerical value which is correlated to a bonding area obtained from that temperature change, and an acceptance/rejection determining means 16 which determines acceptance/rejection of the bonding state of the bonding portion 32 by comparing and contrasting the corrected temperature change with a temperature change indicated by an acceptable product as a comparison criterion or a numerical value which is correlated to a bonding area.

With this correction computing and determining means 4, the temperature change obtained by the two-wavelength radiation thermometer 2 is corrected on the basis of the relational expression for heat capacity. In other words, with the correction computing and determining means 4, correction is performed on the basis of the relational expression for heat capacity that applying the same quantity of heat to the bonding portion 32 having the same construction and made of the same material will give the same temperature. And, the temperature change in a case where the bonding portion 32 has absorbed the same amount of heating power at the time of laser irradiation as that with the reference heating power for an acceptable product as a comparison criterion is obtained. Thereby, the reference for the temperature change of the bonding portion 32 is matched to the reference for the temperature change of an acceptable product as a comparison criterion, and there is provided a temperature change of the bonding portion 32 for which the influence of the absorptivity at the time of laser heating has been eliminated.

And, from the viewpoint that the difference in temperature change is strongly correlated to the difference in bonding area of the bonding portion 32, the acceptance/rejection determining means 16 compares and contrasts the corrected temperature change with a temperature change indicated by an acceptable product as a comparison criterion that has been corrected to the temperature change with the reference heating power, and on the basis of the result of the comparison and contrast, determines acceptance/rejection of the bonding state of the bonding portion 32.

Next, the acceptance/rejection determination method for bonding of fine diameter wire in accordance with the present invention will be explained in detail in the order of the steps thereof.

As described above, the acceptance/rejection determination method for bonding of fine diameter wire in accordance with the present invention includes the heating step of heating the bonding portion of a fine diameter wire with a laser device having a spot diameter which is preferably equal to the wire diameter or smaller, for example, a fine spot diameter of 20 μm; a temperature measurement step of performing temperature measurement on the basis of a minute amount of infrared rays radiated from the heated portion at high speed with the emissivity being corrected; a correction step of correcting the result of measurement in the temperature measurement step for absorptivity of laser; and an acceptance/rejection determination step of determining acceptance/rejection of the bonding by comparing, on the basis of the measuring temperature corrected, the corrected temperature change or a numerical value which is correlated to a bonding area obtained from that temperature change, with a temperature change indicated by an acceptable product as a comparison criterion that has been corrected to the temperature change with the reference heating power or a numerical value which is correlated to a bonding area obtained from that temperature change.

<Heating Step>

This step continuously heats the bonding portion 32 with the same power until the saturation temperature at which no temperature change is observable is reached. In this embodiment, heating of the bonding portion 32 is carried out by laser irradiation made by the heating laser device 1 on the basis of a command from the correction computing and determining means 4. The irradiated laser having a predetermined wavelength is condensed by the condenser lens 11 such that the spot diameter is equal to or smaller than the wire diameter, for example, 20 μm, and then irradiated onto the surface of the bonding portion 32.

The irradiated laser is absorbed on the surface of the bonding portion 32 and converted into heat, thereby the surface temperature of the bonding portion 32 being raised. With the surface temperature of the bonding portion 32 being raised, the heat is passed through the bonding face 32a on the rear face side, being transferred to the lead frame 33 to which the pertinent fine diameter wire 31 is to be bonded, the circuit pattern, and the like. In that case, the temperature of the bonding portion 32 is raised as the time elapses, but the point of time when the quantity of heat applied by the laser becomes equal to the quantity of heat conducted, the temperature rise of the bonding portion 32 is stopped. The heating by the heating laser device 1 is thus continuously performed with the same power until the saturation temperature at which no temperature change is observable is reached.

<Temperature Measurement Step>

This step uses the two-wavelength radiation thermometer 2 to measure the temperature change until the saturation temperature at which no temperature change is observable in the heated portion of the bonding portion 32 is reached. As described above, this two-wavelength radiation thermometer 2 performs measurement of the infrared rays radiated from the bonding portion 32 only for two specific wavelengths, determining the ratio of the amounts of infrared rays for the two specific wavelengths, and outputting the temperature corresponding to that ratio as the temperature of the heated portion of the surface of the bonding portion 32.

At the time of measurement of the amount of infrared rays, the influence of the emissivity of the portion where the infrared rays is radiated cannot be avoided, however, when a substance at a given temperature emits infrared rays, this emissivity is expressed by the ratio of the infrared radiation of the substance to the black body radiation at the same temperature as that of the substance. Therefor, with conventional infrared radiation thermometers which measure the amount of infrared rays to determine the temperature, it has been difficult to measure an accurate temperature of an object to be measured without the emissivity being taken into account. Contrarily to this, in the present invention which uses the two-wavelength radiation thermometer, 2, the amounts of infrared rays at two specific wavelengths are measured, and from the ratio therebetween, the temperature of the surface of the bonding portion 32 is determined, whereby the emissivity of the portion which is laser-heated can be canceled, and thus an accurate temperature of that heated portion can be measured.

<Correction Step>

This step corrects the temperature change measured for the heated portion of the bonding portion 32 to the temperature change with the reference heating power. In other words, the temperature change obtained by the two-wavelength radiation thermometer 2 is corrected to the temperature change with the reference heating power on the basis of the relational expression for heat capacity. By thus correcting, it is made possible to neglect the difference in heating power that is attributable to the influence of the absorptivity at the time of laser heating the bonding portion 32.

The method in accordance with the present invention is for determining acceptance/rejection of the bonding state of the bonding portion 32, and therefore, it is presupposed that there exists a bonded portion, and thus in a case where the metals are not bonded, being separated and no bonding portion being produced, i.e., in a case of a so-called disconnection, this method cannot be applied. The judgment of whether a bonded portion or a disconnection is given can be made on the basis of the temperature measured with the two-wavelength radiation thermometer 2, and when the measured temperature is equal to or higher than a given temperature which is estimated by the relational expression for heat capacity, it is determined that a disconnection is caused, the measurement being terminated. This determination of whether a disconnection is caused or not is performed while the laser being irradiated, and the system is set such that, when it is determined that a disconnection is caused, the laser irradiation is stopped at that point of time.

As the bonding portion 32 is heated by laser irradiation, much heat is transferred from the side of the fine diameter wire 31 to the side of the bonding face 32a, for example, the lead frame 33, thereby the temperature of the heated point which is properly bonded tends to be lowered. Contrarily to this, in a case where the bonding is not sufficient, for example, the fine diameter wire 31 and the lead frame 33 are separated from each other, a disconnected state being caused, heat will not be transferred from the side of the fine diameter wire 31 to the side of the lead frame 33, thereby the temperature of the bonding portion 32 being abruptly raised. If the temperature of the bonding portion 32 is thus abruptly raised, the amount of infrared rays radiated from that surface is also abruptly increased. Therefore, in a case where the temperature measured by the two-wavelength radiation thermometer 2 is equal to or higher than a predetermined value, it can be judged on the basis of the relational expression for heat capacity that a disconnection is caused.

On the other hand, in a case where the temperature measured by the two-wavelength radiation thermometer 2 is lower than a predetermined value, it is judged that the fine diameter wire 31 and the lead frame 33 is not separated from each other, or both are at least bonded, and the temperature change obtained by the two-wavelength radiation thermometer 2 is corrected on the basis of the relational expression for heat capacity. This correction is made in order to eliminate the problem that the temperature change produced as a result of the laser light having been irradiated is greatly influenced by the absorptivity of the bonding portion 32. In other words, this absorptivity is low if the surface condition of the bonding portion 32 is flat, while it is high if the bonding portion 32 has a rough surface, being thus greatly influenced by the condition and geometry of the surface. And thus, this correction becomes necessary.

In this correction step, on the basis of the relational expression for heat capacity that applying the same quantity of heat to the bonding portion having the same construction and made of the same material will give the same temperature, the reference for saturation temperature of the bonding portion 32 is matched to the reference for an acceptable product as a comparison criterion. In other words, by determining the corrected temperature change in a case where the same heating power as the reference heating power for an acceptable product as a comparison criterion has been absorbed, the temperature change for which the influence of the absorptivity at the time of laser heating has been eliminated is obtained.

As the procedure for this correction, various procedures can be considered. For example, in a case where the full laser heating power is defined as the reference heating power, the determination of the absorptivity of the bonding portion 32 may be followed by dividing the temperature change by that absorptivity. Specifically, the correction in this case is performed in two phases, and in the first phase, the absorptivity $\alpha$ of the bonding portion 32 is determined from the relational expression for heat capacity. The absorptivity $\alpha$ can be determined from the relational expression for heat capacity ($C=\alpha Q/T$) that the value of product between the quantity of heat applied Q and the absorptivity $\alpha$ divided by the saturation temperature T of the bonding portion 32 is equal to the heat capacity C.

The saturation temperature T can be obtained with the two-wavelength radiation thermometer 2, and the quantity Q of heat applied is the amount of laser irradiation, which is a known value. The heat capacity C is a value inherent to the bonding portion 32, and the value of heat capacity C for the inspected portion constituted by the fine diameter wire 31 and the bonding portion thereof may be previously determined by measuring an acceptable product, or the like. By substituting these values into the above equation ($C=\alpha Q/T$), the absorptivity $\alpha$ of the bonding portion 32 can be found. Then, in the second phase, the temperature change obtained with the two-wavelength radiation thermometer 2 is divided by the absorptivity $\alpha$ found. By doing this, the corrected temperature change in a case where the reference heating power which is identical to that for an acceptable product has been fully absorbed as in the acceptable product can be determined.

In addition, on the basis of the relational expression for heat capacity that applying the same quantity of heat to the inspected portion having the same construction and made of the same material will provide the same saturation temperature, it can be the that, since the bonding portion 32 has the same construction as that of an acceptable product as a comparison criterion, in a case where the absorptivity of the bonding portion 32 is not matched to the absorptivity of the acceptable product as a comparison criterion, the saturation temperature of the bonding portion 32 becomes different from that of the acceptable product.

From this, the ratio between the saturation temperature of the bonding portion 32 and the saturation temperature of an acceptable product may be determined for multiplying the temperature change of the heated portion by the ratio to determine the corrected temperature change of the bonding portion 32 for providing the same saturation temperature as that of the acceptable product. In other words, assuming that the saturation temperature of an acceptable product is 1, the temperature change is corrected such that the saturation temperature measured with the two-wavelength radiation thermometer 2 is 1.

It can be the that the temperature obtained with the two-wavelength radiation thermometer 2 is a change produced as a result of the partial energy given by multiplying the full heating power Q irradiated by the laser by the absorptivity $\alpha$ having been absorbed. In addition, on the basis of the relational expression for heat capacity, it can be the that, since applying the same quantity of heat to the inspected portion having the same heat capacity will give the same temperature, if the saturation temperature of the bonding portion 32 is made identical to the saturation temperature of an acceptable product as a comparison criterion, the saturation temperature obtained with the two-wavelength radiation thermometer 2 will be identically scaled to the acceptable product as a comparison criterion. This means that making the absorptivities of both identical to each other will correct the temperature change to the temperature change with the reference heating power.

Figure 4:
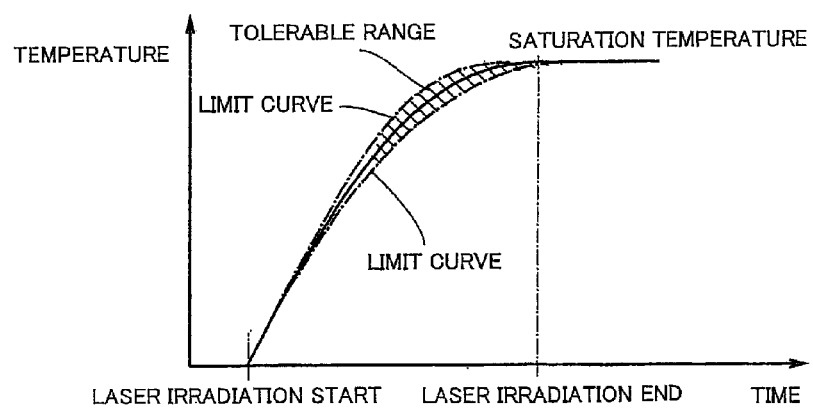
FIG. 4 is a graph illustrating the relation between time period and temperature in the heated portion of a bonding portion.

With the correction step of making such a correction, the reference for temperature change is matched to the reference for a temperature change indicated by an acceptable product as a comparison criterion, thereby the corrected temperature change for which the influence of the absorptivity at the time of the laser heating and the emissivity at the time of the infrared radiation temperature measurement have been eliminated can be obtained. And, as shown in FIG. 4, for example, this corrected temperature change can provide a state in which, as the time elapses, the temperature is raised, and at the point of time when the quantity of heat applied by the laser and the quantity of heat conducted have become identical to each other, the temperature rise of the bonding portion 32 is terminated with no further change being observed.

<Acceptance/Rejection Determination Step>

In this step, the corrected temperature change is compared and contrasted with a temperature change indicated by an acceptable product as a comparison criterion that has been corrected to the temperature change with the reference heating power, and on the basis of the result of comparison and contrast, acceptance/rejection of the bonding state of the bonding portion 32 is determined. This determination of acceptance/rejection is implemented on the basis of the finding that the difference in the temperature change of the bonding portion 32 is strongly correlated to the difference in the bonding area of the bonding portion 32.

This point will be discussed here with reference to the enlarged portion of FIG. 1. The laser heats only the fine diameter wire 31 constituting the bonding portion 32, and a temperature gradient is produced between the fine diameter wire 31 which is heated and the side of the bonding face 32a which is not heated, thereby, as shown with broken line arrows, a flow of heat that is directed from the fine diameter wire 31 toward the lead frame 33 through the bonding face 32a is generated. In this way, the quantity of heat flowing between substances having a temperature difference is in proportion to the product between the bonding area of the bonding portion 32, which is a cross section of the heat conduction path, and the temperature gradient.

In other words, the quantity q of heat flowing from the fine diameter wire 31 to the lead frame 33 through the bonding face 32a is in proportion to the product between the area S of the bonding face 32a and the temperature gradient gradT between the fine diameter wire 31 and the lead frame 33. By the way, the constant of proportionality in this relation is a so-called thermal conductivity K, which is a physical property value depending upon the type of the substance and the condition thereof.

Then, it is obvious that the area of the bonding face 32a has an effect on the quantity of heat flowing from the fine diameter wire 31 toward the lead frame 33, and if the quantity of heat varies, the temperature change of the heated portion will also vary. Therefore, if acceptance/rejection of the bonding state of the bonding portion 32 is determined on the basis of the temperature change which has been corrected such that the heating power Q absorbed by the bonding portion 32 at the time of laser irradiation is identical to the reference heating power for an acceptable product as a comparison criterion, it becomes possible that the bonding portion 32 with which the area of the bonding face 32a has not attained a prescribed value, or the bonding portion 32 with which the area of the bonding face 32a has exceeded a prescribed value is sorted as that of an unsatisfactory bonding state.

Herein, the present invention adopts a concept that a product with which the bonding area of the bonding portion 32 is in the proper range is an acceptable product, on the ground that the area of the bonding portion 32 represents, as it is, the bonding strength between the fine diameter wire 31 and the lead frame 33, and a good-quality electrical conduction path.

In other words, regardless of whether substances are jointed by brazing like soldering, or diffusion bonding like wire bonding, once an integrated state in which the thermal conductivity is good, in other words, free electrons pass between metal ions (logically the electrical resistance is low) is produced, a high bonding strength and a good-quality electrical conduction path are provided. However, in a case where apart of the bonding face 32a has a void, a foreign matter inclusion, or a portion which is not integrated, the bonding strength and the electrical conduction path become unsatisfactory as much. Therefore, by comparing the integrated bonding area of the bonding portion 32 with the reference, the bonding portion 32 can be inspected for the degrees of bonding strength and electrical resistance.

In the memory 15 of the correction computing and determining means 4, a temperature change indicated by an acceptable product which has absorbed the reference heating power is previously stored. In other words, the bonding portions 32 of a plurality of normal samples are irradiated by a laser having a predetermined output; the temperature changes of the samples which are acceptable products are corrected to the temperature change with the reference heating power; and the temperature change obtained is stored in the memory 15 as a temperature change indicated by an acceptable product with the reference heating power. Herein, the reference heating power is defined as that for an acceptable product as a comparison criterion to be utilized in correcting the temperature change of the bonding portion 32 in the temperature change correction step.

And, in this step, the corrected temperature change is compared with a temperature change indicated by an acceptable product as a comparison criterion that has been corrected to the temperature change with the reference heating power. This temperature change comparison for sorting is implemented by invoking, from the memory 15, the upper limit and lower limit of a temperature change indicated by an acceptable product with the reference heating power, and on the basis of whether the corrected temperature change of the bonding portion 32 exists between the upper limit and the lower limit, if the corrected temperature change exists between those limits, the product is sorted as an acceptable one, while, if the corrected temperature change does not exist between those limits, the product is sorted as a rejected one, thus determining acceptance/rejection of the bonding portion 32 being performed.

Next, a specific procedure for this determination method will be explained. First, on the bonding portion 32 of a sample having a required minimum bonding area in the bonding portion 32, the above-described heating step, temperature measurement step, and correction step are implemented, and as shown in FIG. 4, the temperature change is stored in the memory 15 as one limit curve. Likewise, on the bonding portion 32 of a sample having a required maximum bonding area in the bonding portion 32, the above-described heating step, temperature measurement step, and correction step are implemented, and as shown in FIG. 4, the temperature change is stored in the memory 15 as the other limit curve.

In the inspection thereafter, on the bonding portion 32 of respective specimens, the above-described heating step, temperature measurement step, and correction step are implemented in the same manner as described above to obtain the corrected temperature change. Then, for the respective specimens, comparison is performed, in other words, if the integral of the amount of the corrected temperature change over a predetermined time period exists between the integral of the amount of the corrected temperature change that is expressed by the upper limit curve and the integral of the amount of the corrected temperature change that is expressed by the lower limit curve over a given period of time in FIG. 4, the specimen is determined to be an acceptable product, and if the value of the integration is out of this range, the specimen is determined to be a rejected product. In other words, if the curve expressing the corrected temperature change for a particular specimen is accommodated between the limit curves shown in FIG. 4, the specimen is determined to be an acceptable product, while if not accommodated therebetween, the specimen is determined to be a rejected product.

Herein, the phrase "a given period of time" used in the above explanation means the entire time period or a part thereof from the moment when the heating is started to that when the temperature of the bonding portion 32 has reached the saturation temperature. And, it is preferable that the phrase "a given period of time" be interpreted as the period of time until the saturation temperature has been reached, thereby the difference in temperature change can be clearly grasped, the entire shaded area in the figure being taken into consideration. Further, it is preferable that the range of temperature be from the mesial magnitude of the saturation temperature to the saturation temperature. This is because exclusion of the temperature measurements at the beginning of the heating, where background temperature noise is much, can improve the accuracy of determination of acceptance/rejection.

As described above, with the method in accordance with the present invention, the temperature change measured from the heated portion of the bonding portion 32 is corrected to the temperature change with the reference heating power, whereby the difference in temperature change that is attributable to the difference in absorptivity between the inspected portion and an acceptable product as a comparison criterion can be eliminated. And, by comparing and contrasting the corrected temperature change with a temperature change indicated by an acceptable product, acceptance/rejection of the inspected portion can be determined with a relatively high accuracy.

Further, by irradiating the bonding portion 32 with laser light for heating, and measuring the temperature change of the laser irradiated portion with the two-wavelength radiation thermometer 2, it is possible that, regardless of the surface condition and the geometry of the bonding portion 32, the temperature of the laser irradiated portion can be accurately measured. Furthermore, by correcting this temperature change accurately measured to the temperature change with the reference heating power, the corrected temperature change which is not influenced by the absorptivity at the time of the laser heating and the emissivity at the time of the infrared radiation temperature measurement can be obtained, and thus it can be expected that, by comparing and contrasting the corrected temperature change with a temperature change indicated by an acceptable product, the accuracy of determination of acceptance/rejection of the bonding portion 32 is further improved.

The above-described acceptance/rejection determination method for bonding of fine diameter wire in accordance with the present invention can be implemented alone, however, this method may be combined with appearance inspection by image processing for implementation. In that case, the method in accordance with the present invention may be implemented prior to making the appearance inspection by image processing, or may be implemented after the appearance inspection by image processing being performed. In this way, if both inspection methods are used in conjunction, it becomes possible to supply products, such as semiconductors and LEDs, having increased reliability.

Hereinabove, this invention has been explained in detail to some extent about the most preferred embodiment, however, it is obvious that different modes of embodiment can be widely constituted without departure from the spirit and scope of this invention, and therefore, this invention will not be limited to any specific mode of embodiment except as defined in the attached claims.

DESCRIPTION OF SYMBOLS

1: heating laser device
2: two-wavelength infrared radiation thermometer
3: measuring head portion
4: correction computing and determining means
5: stage
11: condenser lens
12: dichroic filter
13: condenser lens
14: temperature change correction means
15: memory
16: acceptance/rejection determining means
31: fine diameter wire
32: bonding portion
32a: bonding portion

The invention claimed is:
1. A method for determining acceptance/rejection of fine diameter wire bonding on a basis of a bonding area of a bonding portion of a fine diameter wire, comprising:
  heating the fine diameter wire with a laser device of a fine spot diameter;
  performing a temperature change measurement at high speed with a correction of an emissivity on a basis of a minute amount of infrared rays radiated from a heated portion of the bonding portion of the fine diameter wire;
  correcting a result of the temperature change measurement for absorptivity of laser to determine a corrected temperature change measurement; and
  determining an acceptance/rejection of bonding by comparing and contrasting, on a basis of the corrected temperature change measurement, the corrected temperature change measurement or a numerical value which is correlated to a bonding area obtained from that temperature change, with a temperature change indicated by an acceptable product as a comparison criterion that has been corrected for absorptivity of laser or a numerical value which is correlated to the bonding area obtained from that temperature change,
  wherein the temperature change measurement is for measuring the temperature change until a saturation temperature at which no temperature change is observable;
  wherein the step of correcting is for correcting the temperature change measurement to the temperature change with the reference heating power in order to correct for absorptivity of laser; and wherein determining the acceptance/rejection is performed by comparing and contrasting the corrected temperature change measurement or a numerical value which is correlated to the bonding area obtained from that temperature change, with a temperature change indicated by an acceptable product as a comparison criterion that has been corrected to the temperature change with the reference heating power or a numerical value which is correlated to the bonding area obtained from that temperature change.

2. The method for determining acceptance/rejection of fine diameter wire bonding according to claim 1, wherein heating is performed with a heating laser device having a spot diameter equal to or smaller than a diameter of the fine diameter wire.

3. The method for determining acceptance/rejection of fine diameter wire bonding according to claim 1, wherein performing the temperature change measurement is performed with a two-wavelength radiation thermometer.

4. The method for determining acceptance/rejection of fine diameter wire bonding according to claim 1, wherein appearance inspection by image processing is used in conjunction.

5. An apparatus for determining acceptance/rejection of a fine diameter wire bonding on a basis of a bonding area of a bonding portion of a fine diameter wire, the apparatus comprising:
   a heating laser device for spot-heating of the bonding portion of the fine diameter wire;
   a two-wavelength infrared radiation thermometer for performing a temperature measurement at high speed with a correction of an emissivity on a basis of a minute amount of infrared rays radiated from a heated portion of the fine diameter wire; and
   a correction computing and determining means for determining an acceptance/rejection of bonding by correcting the result of measurement with the two-wavelength infrared radiation thermometer to the temperature change with the reference heating power, and then comparing a corrected temperature change or a numerical value which is correlated to a bonding area obtained from that temperature change, with a temperature change indicated by an acceptable product as a comparison criterion that has been corrected to the temperature change with the reference heating power or a numerical value which is correlated to the bonding area from that temperature change.

6. The apparatus for determining acceptance/rejection of fine diameter wire bonding according to claim 5, wherein the heating laser device has a spot diameter equal to or smaller than a diameter of the fine diameter wire.

7. The apparatus for determining acceptance/rejection of fine diameter wire bonding according to claim 5, wherein the heating laser device or the two-wavelength infrared radiation thermometer is carried by a measuring head portion having a swinging function for measuring a wedge bonding portion and a ball bonding portion of the fine diameter wire.

8. The apparatus for determining acceptance/rejection of fine diameter wire bonding according to claim 5, further comprising a movement means for positioning the bonding portion of the fine diameter wire in a measuring position.

9. The apparatus for determining acceptance/rejection of fine diameter wire bonding according to claim 5, further comprising an image processing apparatus for performing appearance inspection by image processing.

* * * * *